US008471196B2

(12) United States Patent
Kumano

(10) Patent No.: US 8,471,196 B2
(45) Date of Patent: Jun. 25, 2013

(54) PHOTOELECTRIC CONVERSION APPARATUS AND IMAGING SYSTEM USING THE PHOTOELECTRIC CONVERSION APPARATUS HAVING AN OPTICAL BLACK PIXEL REGION WITH A LIGHT SHIELDING FILM AND A TITANIUM FILM ABOVE A PLUG

(75) Inventor: Hideomi Kumano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 317 days.

(21) Appl. No.: 12/893,006

(22) Filed: Sep. 29, 2010

(65) Prior Publication Data
US 2011/0084196 A1    Apr. 14, 2011

(30) Foreign Application Priority Data

Oct. 13, 2009  (JP) .................... 2009-236432

(51) Int. Cl.
*H01J 5/02* (2006.01)
(52) U.S. Cl.
USPC ........................................ 250/239; 250/208.1
(58) Field of Classification Search
USPC ... 250/239, 208.1, 226, 214 R; 348/302–294; 257/292–294, 434–437
See application file for complete search history.

(56) References Cited

U.S. PATENT DOCUMENTS

| 8,184,189 B2 * | 5/2012 | Tamura .................. 348/308 |
| 2006/0186547 A1 | 8/2006 | Wang et al. .............. 257/758 |
| 2009/0189236 A1 | 7/2009 | Hayashi et al. .......... 257/432 |

FOREIGN PATENT DOCUMENTS

| CN | 1825605 A | 8/2006 |
| JP | 2008-218755 A | 9/2008 |
| JP | 2009-200462 A | 9/2009 |
| KR | 2004-0103016 A | 12/2004 |

OTHER PUBLICATIONS

M. Okigawa et al., "Drastically Reduced Dark Current by Pulse-Time-Modulated Plasma and Gas Optimization for Sensitive CCD Image Sensor," ITE Technical Report, vol. 28, No. 23, pp. 19-22, Mar. 2004.

* cited by examiner

*Primary Examiner* — Que T Le
(74) *Attorney, Agent, or Firm* — Fitzpatrick, Cella, Harper & Scinto

(57) ABSTRACT

A photoelectric conversion apparatus includes an effective pixel region for outputting a signal according to light, and an optical black pixel region for outputting a reference signal, wherein, in the optical black pixel region, a plug is arranged in an insulating film, and a light shielding film is arranged above the plug and is connected to the plug, such that an upper surface of the plug and an upper surface of the insulating film form the same plane, and wherein, above or below the light shielding film, a titanium film of thickness 5 to 15 nm is arranged.

6 Claims, 4 Drawing Sheets

PHOTOELECTRIC CONVERSION APPARATUS AND IMAGING SYSTEM USING THE PHOTOELECTRIC CONVERSION APPARATUS HAVING AN OPTICAL BLACK PIXEL REGION WITH A LIGHT SHIELDING FILM AND A TITANIUM FILM ABOVE A PLUG

BACKGROUND OF THE INVENTION

1. Field of the Invention

The present invention relates to a photoelectric conversion apparatus.

2. Description of the Related Art

CCD and CMOS photoelectric conversion apparatuses are used in a multiplicity of digital still cameras and digital camcorders. Particularly, the CMOS photoelectric conversion apparatuses are superior in power consumption and multi-functionality, and the application range is expanding in recent years.

Recently, miniaturization of pixels is demanded in the photoelectric conversion apparatuses, and chemical mechanical polishing (CMP processing) is performed as a miniaturization process in the formation of a plug. FIG. 1 of Japanese Patent Application Laid-Open No. 2008-218755 describes a configuration of a contact when the CMP processing is executed to form a plug. Japanese Patent Application Laid-Open No. 2008-218755 tackles a problem that there is a difference in the dark current of an optical black pixel region and an effective pixel region, and barrier metal layers are formed by layers including a titanium nitride layer and a titanium layer.

Mitsuru Okigawa, "Low-Damage Plasma Process for Solid-State Imaging Element", The Institute of Image Information and Television Engineers Technical Report, Vol. 28, No. 23, pp. 19 to 22 describes that an ultraviolet ray of 250 to 350 nm generated in a plasma process, such as etching and CVD, increases an interface state between silicon and a silicon oxide film and causes a dark current.

The present inventors have found out that the difference in the dark current of the optical black pixel region and the effective pixel region is influenced not only by a hydrogen-terminated treatment but also by a damage caused by the ultraviolet ray of 250 to 350 nm in etching and plasma processing.

The present invention has been made in view of the foregoing problem, and an object of the present invention is to provide a photoelectric conversion apparatus and an imaging system capable of reducing a difference in the dark current of an optical black pixel region and an effective pixel region when a miniaturization process is executed.

SUMMARY OF THE INVENTION

The present invention provides a photoelectric conversion apparatus comprising: an effective pixel region for outputting a signal according to light; and an optical black pixel region for outputting a reference signal, wherein, in the optical black pixel region, a plug is arranged in an insulating film, and a light shielding film is arranged above the plug and is connected to the plug, such that an upper surface of the plug and an upper surface of the insulating film form the same plane, and wherein, above or below the light shielding film, a titanium film of thickness 5 to 15 nm is arranged.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

A photoelectric conversion apparatus according to the present invention is a photoelectric conversion apparatus including an optical black pixel region and an effective pixel region, and a titanium film with 5 to 15 nm thickness is at least arranged above or below a light shielding film that is arranged above a plug of the optical black pixel region. According to such a configuration, an increase in the dark current due to the hydrogen absorbing effect of the titanium film and an increase in the dark current due to etching or plasma processing can be prevented, and the dark current of the optical black pixel region can be reduced.

Hereinafter, embodiments will be illustrated to describe the present invention in detail. The present invention is not limited to the embodiments. Appropriate modifications can be made, and a plurality of embodiments may be combined. As for "above" and "below" in the present specification, a depth direction of substrate based on a main plane where a device is arranged on a semiconductor substrate will be referred to as a "below" direction, and the opposite direction will be referred to as an "above" direction. Although a substrate as a material substrate will be expressed as a "substrate", such a material substrate may be processed, and for example, a member including one or a plurality of semiconductor regions, a member in the middle of a series of manufacturing processes, or a member after the series of manufacturing processes can also be called a substrate.

(First Embodiment)

Figure 1A:
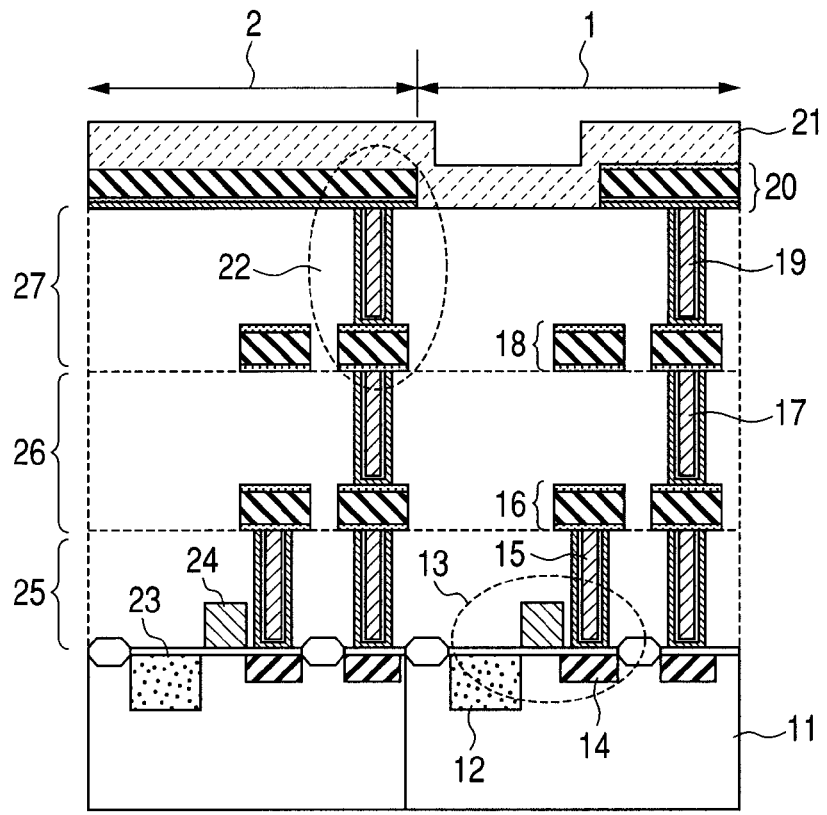
FIG. 1A is a cross-sectional view illustrating a structure of a photoelectric conversion apparatus according to a first embodiment of the present invention.
Figure 1B:
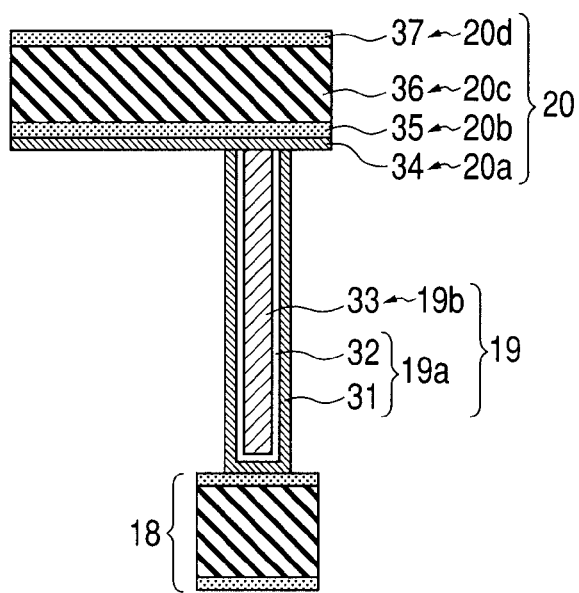
FIG. 1B is an enlarged cross-sectional view of a broken-line region 22 of FIG. 1A.

A photoelectric conversion apparatus according to a first embodiment of the present invention will be described with reference to FIGS. 1A and 1B. FIG. 1A is a cross-sectional view illustrating a structure of the photoelectric conversion apparatus according to the first embodiment of the present invention.

In FIG. 1A, the photoelectric conversion apparatus includes an effective pixel region 1 and an optical black pixel region 2. A plurality of pixels (unit pixels) including photodiodes (photoelectric conversion units) PD for generating signals according to light and transistors (for example, amplifying MOS transistors not shown) for outputting the signals of the PD are arranged in the effective pixel region 1. A light shielding film is arranged above the pixels on the optical black pixel region 2 to read out a reference signal of black gradation (black reference signal).

Basic configurations of the pixels of the effective pixel region 1 and the pixels of the optical black pixel region 2 are the same. More specifically, the pixel (unit pixel) includes a semiconductor region 11, a semiconductor region 12, a transfer MOS transistor 13, a floating diffusion region (hereinafter, "FD region") 14, and a contact plug 15. The photoelectric conversion apparatus includes a first wiring layer 16, a first via plug 17, a second wiring layer 18, a second via plug 19, a third wiring layer 20, and a passivation film (upper layer) 21. The photoelectric conversion apparatus further includes a first insulating film 25, a second insulating film 26, and a third insulating film 27 for insulating wiring and wiring layers.

The semiconductor region 11 is a semiconductor region of a first conductive type (for example, P type). The semiconductor regions 12 and 23 are semiconductor regions of a second conductive type (for example, N type) that is a conductive type opposite the first conductive type. The semiconductor regions 11 and 12 form a PN junction and constitute a photodiode PD that functions as a photoelectric conversion unit. When the electric charge is an electron, the semiconductor region 12 accumulates the electric charge.

The transfer MOS transistor 13 transfers the electric charge accumulated in the semiconductor region 12 of the photodiode PD to the FD region 14 when a signal for activation is supplied to a gate of the transfer MOS transistor 13. The transfer MOS transistor 13 is also arranged in the optical black pixel region, and FIG. 1A illustrates a gate electrode 24 of the transfer MOS transistor.

The FD region 14 is a semiconductor region of the second conductive type. The electric charge is transferred by the transfer MOS transistor 13 to the FD region 14. The FD region 14 also functions as a drain region of the transfer MOS transistor 13. The contact plug 15 connects the FD region 14 and the first wiring layer 16. The first wiring layer 16 is connected to the second wiring layer 18 through the first via plug 17. The second wiring layer 18 is connected to the third wiring layer 20 through the second via plug 19. The third wiring layer 20 (core layer described later) functions as a light shielding layer. The wiring layer 20 on the upper side of the photodiode PD is open in the effective pixel region 1. On the other hand, the optical black pixel region 2 is covered by the wiring layer 20 on the upper side of the photodiode PD. This is a different point between the pixels of the effective pixel region 1 and the pixels of the optical black pixel region 2.

The passivation film 21 extends across the effective pixel region 1 and the optical black pixel region 2 along the upper surface of the third wiring layer 20. The passivation film 21 is formed by, for example, silicon nitride. The passivation film 21 can include hydrogen and can diffuse hydrogen during heat treatment to reduce the interface state between silicon and a silicon oxide film. More specifically, the passivation film 21 functions as a hydrogen supplying layer in hydrogen terminated processing. Herein, the interface state between silicon and a silicon oxide film is for example an interface between a substrate including the semiconductor region 11 and a gate insulating film. The passivation film 21 is formed on the entire surfaces of the effective pixel region 1 and the optical black pixel region 2. The passivation film 21 may be removed after the hydrogen terminated processing. The removal of the passivation film 21 facilitates adjustment of the refractive index in the light path, and the incidence rate of light to the photoelectric conversion unit can be improved.

Detailed configurations of the second via plug 19 and the third wiring layer 20 will be described with reference to FIG. 1B. FIG. 1B is an enlarged cross-sectional view of the broken-line region 22 of FIG. 1A.

The second via plug 19 includes a first barrier metal layer 19a and a core layer 19b and is arranged on the third insulating film 27. The first barrier metal layer 19a includes a titanium layer 31 and a titanium nitride layer 32. The titanium layer 31 is arranged to cover the titanium nitride layer 32. The titanium layer (first material layer) 31 is formed by titanium (first material). The titanium nitride layer 32 is arranged to cover the core layer 19b. The titanium nitride layer (second material layer) 32 is formed by titanium nitride (second material). The core layer 19b includes a tungsten layer 33. The tungsten layer 33 is filled in a recessed portion of the titanium nitride layer 32. The tungsten layer 33 is formed by tungsten. CMP processing is executed to form the tungsten layer 33 as the core layer 19b. Therefore, in the second via plug 19, the first barrier metal layer 19a and the core layer 19b as well as the third insulating film 27 are exposed at the same time to form the same plane (coplanar).

The third wiring layer 20 is arranged above the second via plug. The third wiring layer 20 includes a titanium layer 20a, a second barrier metal layer 20b, and a core layer 20c. The titanium layer 20a includes a titanium layer 34. The titanium layer 34 is formed by titanium. The titanium layer 34 extends along the lower surface of a titanium nitride layer 35. The titanium layer 34 is arranged between the second via plug 19 and the titanium nitride layer 35. The titanium layer 34 includes a film thickness of 5 to 15 nm (when film thickness is set as d, a relation $5\,mn \leq d \leq 15\,mn$ is met.) and functions as an absorbing layer of an ultraviolet ray of 250 to 350 nm. Second barrier metal layers 20b and 20d include a titanium nitride layer 35 and a titanium nitride layer 37. The titanium nitride layer 35 extends along the lower surface of the core layer 20c. The titanium nitride layer 35 is formed between the titanium layer 34 and the core layer 20c. The titanium nitride layer 35 is formed by titanium nitride. The titanium nitride layer 37 is formed above the core layer 20c. The titanium nitride layer 37 is formed by titanium nitride. The core layer 20c includes an aluminum alloy layer 36. The aluminum alloy layer 36 is formed between the titanium nitride layer 35 and the titanium nitride layer 37. The aluminum alloy layer 36 is formed by an aluminum alloy including aluminum as a principal component.

Although a layer formed by titanium is also arranged below the third wiring layer 20 arranged in the effective pixel region 1, the layer formed by titanium may not be partially arranged.

The structure of the third wiring layer 20 allows effective absorption of an ultraviolet ray of 250 to 350 nm applied to the optical black pixel region, and the dark current of the optical black pixel region can be reduced. Details will be described below.

As described in Japanese Patent Application Laid-Open No. 2008-218755, if the difference in the dark current of the optical black pixel region and the effective pixel region is caused by the hydrogen absorbing effect of the titanium layer, the film thick of the titanium layer of the optical black pixel region can be set to 0. However, the present inventors have found out that the difference in the dark current of the optical black pixel region and the effective pixel region is not only caused by the hydrogen absorbing effect of the titanium layer, and the increase in the dark current caused by etching and plasma damage cannot be ignored.

Figure 2:
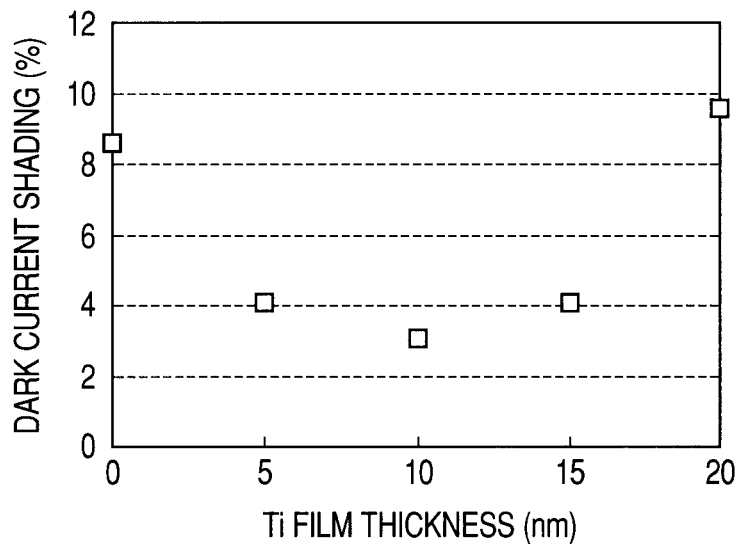
FIG. 2 is a plot diagram illustrating a relationship between film thickness of a titanium film and dark current.

FIG. 2 illustrates differences in the dark current of the optical black pixel region and the effective pixel region when the film thickness of the titanium layer 20a is changed. The difference in the dark current of the optical black pixel region and the effective pixel region is a minimum value when the film thickness of the titanium layer is about 10 nm. The difference in the dark current gradually increases between about 5 to 15 nm. The inclination is large when the film thickness is 5 nm or less or 15 nm or more, and the difference in the dark current of the optical black pixel region and the effective pixel region is large.

Figure 3:
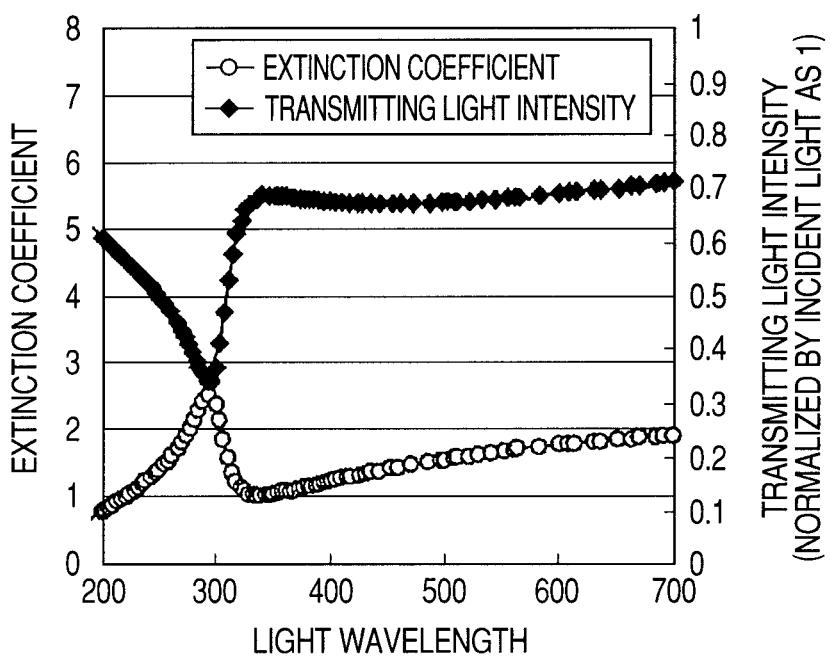
FIG. 3 is a plot diagram illustrating extinction coefficient of light and light transmitting intensity.

FIG. 3 illustrates extinction coefficient of light and light transmitting intensity when light is directed from the upper surface of the titanium layer. The titanium layer is a titanium layer with 10 nm thickness made of titanium, similar to the titanium layer 20a illustrated in FIGS. 1A and 1B. As illustrated in the extinction coefficient of FIG. 3, the titanium layer has a peak of light absorption when the wavelength is about 300 nm, and the light transmitting intensity indicates the minimum value at the corresponding wavelength. Therefore, it can be recognized from the light transmitting intensity that the titanium layer does not transmit light with wavelength of 250 to 350 nm. Even if light is directed from the upper surface of the titanium layer, light of about 250 to 350 nm is not easily transmitted below the titanium layer.

More specifically, as illustrated in FIG. 3, the phenomenon in FIG. 2 is caused by the absorption of ultraviolet ray of 250 to 350 nm by the titanium layer 20a and by the hydrogen absorbing effect of the titanium layer. Unlike the effective pixel region 1, the optical black pixel region 2 is covered by the light shielding layer 20 including the titanium layer. Therefore, the titanium layer 20a absorbs the ultraviolet ray of 250 to 350 nm generated in the plasma processing after the formation of the titanium layer 20a, and the dark current of the pixels in the optical black pixel region 2 can be reduced. The influence of the hydrogen absorbing effect is large if the film thickness of the titanium layer 20a is 15 nm or more due to the hydrogen absorbing effect of the titanium layer. And the dark current increases because the hydrogen terminated processing for reducing the interface state after the formation of the titanium layer 20a is inhibited. Therefore, it is desirable that the film thickness of the titanium layer is between 5 to 15 nm to effectively execute the hydrogen terminated processing while effectively absorbing the ultraviolet ray.

Since there is no light shielding film in the effective pixel region 1, the interface state caused by the ultraviolet ray of 250 to 350 nm may be greater than that of the optical black pixel region 2. However, since the volume of the titanium layer is small, the effect of the hydrogen treatment for reducing the interface state is greater than that of the optical black pixel region. This can reduce the difference in the dark current of the effective pixel region and the optical black pixel region, and excellent image quality can be obtained.

For example, when the titanium layer 20a is not arranged above the second via plug 19, the second via plug 19 includes a titanium layer. However, the formation of a titanium layer with uniform film thickness by filling a via hole is difficult, an unevenness would be caused in a thickness of the titanium layer. In such a case, there may be variations in the dark current in the optical black pixel region. Therefore, arranging the titanium layer 20a in a range of 5 to 15 nm film thickness on the plane along the third wiring layer 20 can uniformly reduce the dark current in the optical black pixel region. In the present embodiment, the titanium layer 20a has the same pattern as the core layer c of the third wiring layer 20. The same pattern denotes a configuration of including the same plane layout on the plane along the third wiring layer 20. Such a configuration facilitates uniform reduction of the dark current in the optical black pixel region.

As described, according to the configuration of the present embodiment, the hydrogen absorbing effect of the titanium layer and the prevention effect of the plasma damage can be well balanced, and the difference in the dark current of the effective pixel region and the optical black pixel region can be reduced.

(Modified Example of First Embodiment)

Figure 4A:
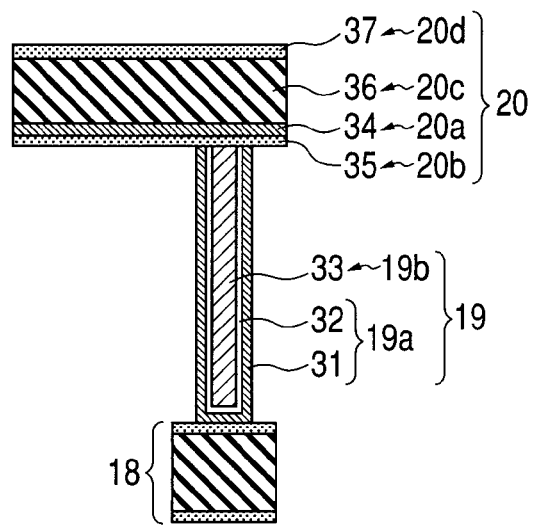
FIGS. 4A, 4B and 4C are cross-sectional views illustrating modified structures of the photoelectric conversion apparatus according to the first embodiment of the present invention.
Figure 4B:
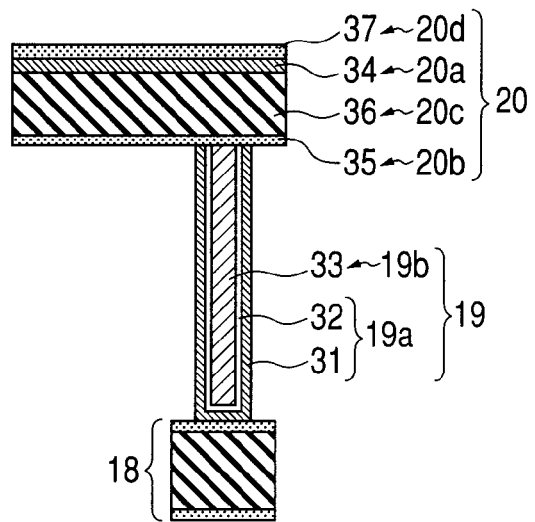
Figure 4C:
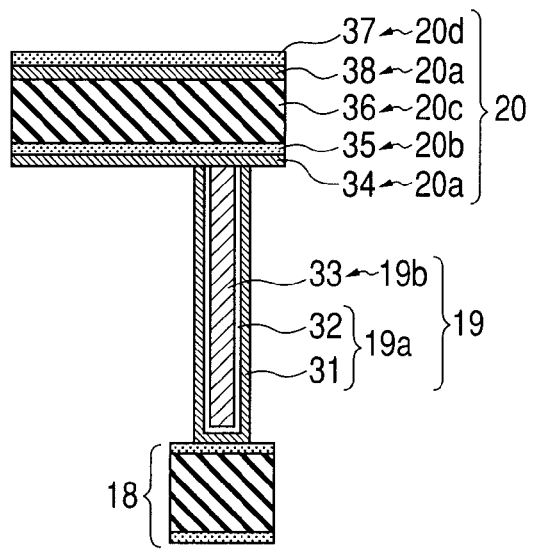

FIGS. 4A to 4C illustrate a modified example of the photoelectric conversion apparatus according to the first embodiment of the present invention. FIGS. 4A to 4C are cross-sectional views corresponding to FIG. 1B. The same functions as in FIG. 1B are designated with the same reference numerals, and detailed description will not be repeated.

The titanium layer 34 is arranged below the titanium nitride layer 35 in FIG. 1B. However, the titanium layer 34 is arranged above the titanium nitride layer 35 in FIG. 4A. The titanium layer 34 is arranged above the aluminum alloy layer 36 in the configuration of FIG. 4B. In FIG. 4C, the titanium layer 34 is arranged below the aluminum alloy layer 36, and the titanium layer 38 is arranged above the aluminum alloy layer 36. The thickness of the titanium layers 34 and 38 is 5 to 15 nm (when the film thickness si set as d, a relation 5 nm≦d≦5 mn is met.) in total, and the ratio of the film thicknesses does not matter.

As illustrated in FIGS. 4A to 4C, titanium layers are arranged above or below or above and below the third wiring layer 20, and the film thickness is 5 to 15 nm in total. This can reduce the difference in the dark current of the effective pixel region and the optical black pixel region as in the first embodiment.

Furthermore, various changes can be made without departing from the scope of the present invention.

(Application to Imaging System)

Figure 5:
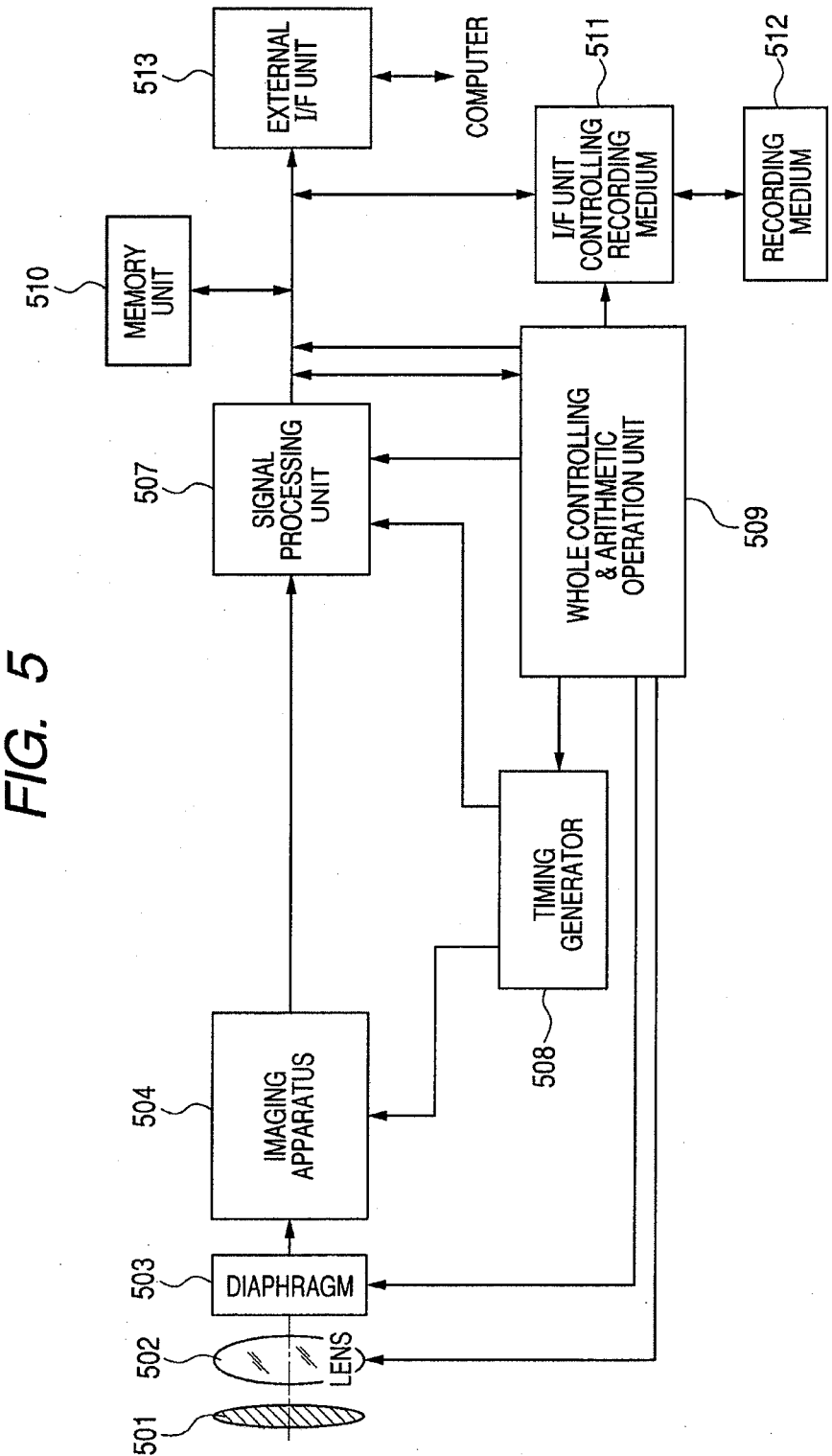
FIG. 5 is a block diagram describing an imaging system.

An embodiment in which the photoelectric conversion apparatus of the present invention is applied to an imaging system as an imaging apparatus will be described in detail. Examples of the imaging system include a digital still camera and a digital camcorder. FIG. 5 illustrates a block diagram when the photoelectric conversion apparatus is applied to a digital still camera as an example of the imaging system.

In FIG. 5, reference numeral 501 denotes a barrier for protecting a lens. Reference numeral 502 denotes a lens for forming an optical image of a subject on an imaging apparatus 504. Reference numeral 503 denotes a diaphragm for changing the amount of light passing through the lens 2. Reference numeral 504 denotes an imaging apparatus that is described in the embodiments and that converts the optical image formed by the lens 502 to image data. It is assumed that an AD converter is formed on a substrate of the imaging apparatus 504. Reference numeral 507 denotes a signal processing unit that applies various corrections or compresses the imaging data output by the imaging apparatus 504. In FIG. 5, reference numeral 508 denotes a timing generator that outputs various timing signals to the imaging apparatus 504 and the signal processing unit 507. Reference numeral 509 denotes a whole controlling & arithmetic operation unit that controls various arithmetic operations and the entire digital still camera. Reference numeral 510 denotes a memory unit for temporarily storing image data. Reference numeral 511 denotes an interface unit for recording or reading out data to and from a recording medium. Reference numeral 512 denotes a removable recording medium, such as a semiconductor memory, for recording or reading out imaging data. Reference numeral 513 denotes an interface unit for communicating with an external computer, etc. Timing signals, etc. may be input from outside the imaging system, and the imaging system may include at least the imaging apparatus 504 and the signal processing unit 507 that processes imaging signals output from the imaging apparatus. Although the imaging apparatus 504 and the AD converter are formed on the same substrate in the present embodiment, the imaging apparatus and the AD converter may be arranged on different substrates. The imaging apparatus 504 and the signal processing unit 507 may be formed on the same substrate. In this way, the photoelectric conversion apparatus of the present invention can be applied to the imaging system. Applying the photoelectric conversion apparatus of the present invention to the imaging system allows photographing of a low-noise image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-236432, filed Oct. 13, 2009, which is hereby incorporated by reference herein in its entirety.

What is claimed is:

1. A photoelectric conversion apparatus comprising:
 an effective pixel region for outputting a signal according to received light; and
 an optical black pixel region for outputting a reference signal,
 wherein, in said optical black pixel region, a plug is arranged in an insulating film, and a light shielding film is arranged above said plug and is connected to said plug, such that an upper surface of said plug and an upper surface of said insulating film form the same plane, and
 wherein, above or below said light shielding film, a titanium film of thickness 5 to 15 nm is arranged.

2. The photoelectric conversion apparatus according to claim 1, wherein said titanium film is arranged between said light shielding film and said plug.

3. The photoelectric conversion apparatus according to claim 1, wherein said titanium film is formed into the same pattern as is said light shielding film.

4. The photoelectric conversion apparatus according to claim 1, wherein said plug and said insulating film are formed by CMP processing.

5. The photoelectric conversion apparatus according to claim 1, wherein said plug comprises a core layer and a barrier metal layer, and said core layer and said barrier metal layer of the plug form the same plane with said insulating film.

6. A photoelectric conversion apparatus according to claim 1, wherein the photoelectric conversion apparatus is incorporated in an imaging system that includes a signal processing unit for processing an imaging signal outputted from the photoelectric conversion apparatus.

* * * * *